US008722197B2

(12) United States Patent
Maurin-Perrier et al.

(10) Patent No.: US 8,722,197 B2
(45) Date of Patent: May 13, 2014

(54) SLIDING MATING PART IN LUBRICATED REGIME, COATED BY A THIN FILM

(75) Inventors: Philippe Maurin-Perrier, Saint Marcellin en Forez (FR); Florent Ledrappier, Saint-Etienne (FR); Laurent Houze, Saint Etienne (FR)

(73) Assignee: H.E.F., Andrezieux Boutheon (FR)

( * ) Notice: Subject to any disclaimer, the term of this patent is extended or adjusted under 35 U.S.C. 154(b) by 1103 days.

(21) Appl. No.: 12/444,240

(22) PCT Filed: Oct. 16, 2007

(86) PCT No.: PCT/FR2007/052173
§ 371 (c)(1),
(2), (4) Date: Jul. 27, 2009

(87) PCT Pub. No.: WO2008/047044
PCT Pub. Date: Apr. 24, 2008

(65) Prior Publication Data
US 2010/0095923 A1  Apr. 22, 2010

(30) Foreign Application Priority Data
Oct. 20, 2006  (FR) ...................................... 06 54415

(51) Int. Cl.
*B32B 9/00* (2006.01)
*C01B 31/02* (2006.01)

(52) U.S. Cl.
USPC ........... 428/469; 428/408; 428/472; 428/612; 428/682; 423/445 R

(58) Field of Classification Search
USPC .......................................................... 428/612
See application file for complete search history.

(56) References Cited

U.S. PATENT DOCUMENTS

| 5,224,782 | A | * | 7/1993 | Miwa et al. .................... 384/100 |
| 6,468,673 | B2 | * | 10/2002 | Saito .............................. 428/653 |
| 7,086,362 | B2 | * | 8/2006 | Mabuchi et al. ............. 123/90.52 |
| 2004/0241448 | A1 | * | 12/2004 | Kano et al. .................... 428/408 |
| 2005/0005892 | A1 | * | 1/2005 | Nishimura et al. ........ 123/193.4 |

FOREIGN PATENT DOCUMENTS

| EP | 1207314 A2 | 5/2002 |
| WO | WO0179585 A | 10/2001 |
| WO | WO03091474 A | 11/2003 |

OTHER PUBLICATIONS

The International Search Report for PCT/FR2007/052173, dated Mar. 27, 2008.

* cited by examiner

*Primary Examiner* — Gwendolyn Blackwell
*Assistant Examiner* — Seth Dumbris
(74) *Attorney, Agent, or Firm* — Heslin Rothenberg Farley & Mesiti P.C.

(57) ABSTRACT

A thin layer is deposited on a surface having a roughness profile whereof the parameters and mean period are determined for improving the tribological performance, so that the ratio A between the square of the mean period of the profile ($P_{SM}$) in µm and the roughness profile (Pa) in µm, as defined by French standard ISO 4288, is equal to or greater than $5 \times 10^5$ µm.

10 Claims, No Drawings

SLIDING MATING PART IN LUBRICATED REGIME, COATED BY A THIN FILM

CROSS REFERENCE TO RELATED APPLICATIONS

This application is a national stage filing under section 371 of International Application No. PCT/FR2007/052173 filed on Oct. 16, 2007, and published in French on Apr. 24, 2008 as WO 2008/047044 and claims priority of French application No. 0654415 filed on Oct. 20, 2006, the entire disclosure of these applications being hereby incorporated herein by reference.

BACKGROUND ART

The invention relates to the technical field of tribology in lubricated regime.

More particularly, the invention relates to coatings and surface treatments for reducing wear and for minimizing the transmission of tangential forces.

Numerous technical solutions have been proposed for improving the tribological performance of mechanical parts. A distinction is made essentially between conventional case hardening treatments and deposits of thin and hard layers obtained by various methods such as PVD (Physical Vapour Deposition) or PACVD (Plasma Assisted Chemical Vapour Deposition).

Among the deposits of thin and hard layers, mention can be made of deposits of transition metal nitrides (TiN, CrN, TiAlN, etc.), coatings of amorphous carbon (DLC), etc. For technical, as well as mechanical reasons, it appears that these deposits of surface coatings do not generally exceed 5 μm. Above this thickness, risks of embrittlement of the layer and flaking may occur. It is also important to obtain perfect adhesion and strength of the thin layer over time. Thus, a person skilled in the art claims very slightly irregular surface textures with a roughness (Ra) of about 0.04 μm.

It therefore appears from the prior art that the tribological performance of the surface treatments and vacuum deposits are only guaranteed with surfaces having a slight roughness.

For example, mention can be made of the teaching of U.S. Pat. No. 6,886,521, which sets a maximum value of the surface roughness parameter (Rz) as a function of the hardness of the DLC deposit and the thickness thereof. A person skilled in the art generally claims the lowest possible roughnesses, that is, for example, Ra≤0.04 μm.

Thus, it appears from the analysis of the prior art that high surface roughnesses are unsuitable for receiving hard deposits, because this produces surface irregularities leading to local overpressures liable to cause excessive plastic deformation detrimental to the mechanical strength of the coating. Furthermore, in lubricated regime, when the amplitude of the roughnesses is too high, the oil film is locally broken and the surfaces which are in relative motion are no longer perfectly separated, thereby giving rise to an increase in the friction coefficient and premature wear of the said surfaces.

Scientific publications in the field of tribology also discuss the influence of roughness on lubrication. Mention can be made for example of: "Occurrence of microelastohydrodynamic lubrication in simple sliding motion with transverse roughness"—J. Wang, M. Kaneta, F. Guo, P. Yang—Journal of Engineering Tribology—Vol. 220 No. J13 (May 2006) pp. 273-285.

It appears from these publications that the amplitude of the surface roughnesses must be considered, with the conclusion that the lowest possible roughnesses must be sought in order to decrease the friction coefficient.

Also noteworthy, as it appears from the scientific publication: "Influence of harmonic surface roughness on the fatigue life of elastohydrodynamic lubricated contact"—A. D. Chapkov, F. Colin, A. A. Lubrecht—Journal of Engineering Tribology—Vol. 220 No. J13 (May 2006) pp. 287-294", is that the numerical analysis of the rough surface contact treated as sinusoidal profiles, reveals overpressure effects associated with the irregularities of the contact surfaces, and indicates that these overpressures may be limited by increasing the profile period. However, this decrease in the contact pressure on high wavelength profiles, is explained by an elastic deformation of the substrate. In the case of hard deposits obtained by the PVD or PACVD method, these deposits, due to their high modulus of elasticity and their high hardness, cannot accommodate the deformation of the substrate, so that they are rapidly damaged.

It therefore appears clearly from the prior art, in the field of tribology, that the thin layer deposits, for example in the case of amorphous carbon, must be carried out on surfaces having very high finish levels with a roughness (Ra) not exceeding a few hundredths of a micron and generally less than 0.04 μm.

BRIEF SUMMARY OF INVENTION

In a surprising and unexpected manner with regard to the general knowledge of a person skilled in the art, it has appeared that a surface texture having a certain roughness, with a sufficiently high period, can allow for thin deposits obtained by a PVD or PACVD method, when the parts work in lubricated regime.

It therefore results, according to one basic feature of the invention, that the thin layer is deposited on a surface having roughness profiles whereof the parameters and mean periods are determined for improving the tribological performance. These particular roughness profiles are obtained by selecting appropriate machining parameters (turning, milling, speed of rotation of the broach, tool feed, etc.).

More particularly, according to one basic feature of the invention, the ratio A between the square of the mean period of the profile ($P_{SM}$) in μm and the roughness profile (Pa) in μm, as defined by French standard ISO 4288, is equal to or greater than $5 \times 10^5$ μm, that is:

$$A = \frac{P_{SM}^2 \geq 5 \times 10^5 \; \mu m}{Pa}$$

Due to the wide dispersion of the parameter ($P_{SM}$), this formula applies to mean parameters calculated from 8 measurements taken at the friction zone and parallel to the sliding direction.

Tribological tests have also given remarkable results with (A) higher than $10^6$ μm even better with (A) higher than $10^7$ μm.

It is consequently possible to tolerate surface textures that are severely degraded, with a profile height that is normally not tolerated, by only using the waviness period.

The application of the preceding formula, for a profile having a roughness (Pa) of 0.4 μm shows that good results are obtained when the mean period of this profile ($P_{SM}$) is higher than 450 μm. Even better results are obtained when the mean period of this profile ($P_{SM}$) is higher than 2 mm.

Due to the basic features of the invention, contrary to the teaching of the prior art, where it was necessary to obtain a surface texture with high finish levels, it is consequently possible to obtain, at minimum cost, parts with equivalent or even superior tribological performance.

Thus, if for economic or technical reasons, it is not possible to obtain remarkable surface textures by lapping, grinding or other methods, according to the invention, it suffices to summarily roughen the surface, in order to limit the presence of sharp edges and roughness peaks, while only preserving the surface waviness associated with the upstream machining methods. The latter are even optimized (speed of rotation, tool feed, etc.), in order to maximize the parameter (A) defined above. These wavinesses serve to obtain a sinusoidal profile acceptable for lubrication, which proves advantageous for reducing the fabrication costs for assembly line market applications.

It should be noted that numerous methods are available for obtaining a high period on roughness features, and they are generally easy to carry out using conventional machining methods: turning, milling, etc.

DETAILED DESCRIPTION

Reference can now be made to the table below which shows various examples of treatment according to the invention. The parts or samples are flat test specimens obtained by various machining methods, in order to observe the influence of the surface preparation and the friction coefficient during a test in lubricated regime. The surfaces were coated with a deposit on DLC by the PACVD method. The samples were tested in lubricated regime in a 5W30 oil bath heated to 100° C. opposite an untreated 100C6 steel ring rotating at constant speed. The friction coefficient of the ring facing the sample was measured during the tests. Four samples (A), (B), (C), (D) were prepared to compare their friction coefficient.

| Sample | $R_a$ (μm) | $R_z$ (μm) | $P_a$ (μm) | $P_{SM}$ (μm) | A = $P_{SM}^2/P_a$ (μm) | Friction coefficient | Degraded area (mm$^2$) |
|---|---|---|---|---|---|---|---|
| A | 0.014 | 0.12 | 0.18 | 240 | $3 \times 10^5$ | 0.089 | 2.9 |
| B | 0.042 | 0.25 | 0.23 | 1300 | $7 \times 10^6$ | 0.087 | 1.0 |
| C | 0.036 | 0.20 | 0.23 | 2400 | $2.5 \times 10^7$ | 0.065 | 0.6 |
| D | 0.12 | 0.79 | 0.34 | 578 | $10^6$ | 0.088 | 2.1 |

These results demonstrate that the ratio A defined above influences the friction coefficient more than the roughness parameters (Ra) and (Rz). It is observed, for example, that sample (A), despite a very low roughness, does not fit into the field of the invention and has the highest friction coefficient in the table. On the contrary, sample (C), although having a much higher (Ra) than that of sample (A), has a very high ratio A and displays slight friction behaviour.

The advantages clearly appear from the description.

The invention finds advantageous applications in the automobile field, particularly in the case of friction parts in the engine.

The invention claimed is:

1. Sliding contact part, adapted to operate in a lubricated regime, coated with a thin hard layer having a thickness no greater than 5 μm and a tribological function, wherein the thin layer is deposited by at least one of physical vapor deposition and plasma assisted chemical vapor deposition on a surface having a roughness profile, parameters and a mean period of the roughness profile of the surface prior to thin layer deposition being determined for improving tribological performance such that a ratio A between the square of the mean period of the profile (PSM) in μm and the roughness profile (Pa) in μm, as defined by French standard ISO 4288, is equal to or greater than 5×105 μm, that is:

$$A = \frac{P_{SM}^2 \geq 5 \times 10^5 \text{ μm}}{Pa,}$$

whereby equivalent or superior tribological performance is attained without the necessity of applying a high finish level to the surface.

2. Part according to claim 1, wherein the ratio A is higher than $10^6$ μm.

3. Part according to claim 2, wherein the ratio A is higher than $10^7$ μm.

4. Part according to claim 1, wherein the roughness profile Pa is about 0.4 μm, and the mean period of the said profile is $P_{SM}$ is higher than 450 μm.

5. Part according to claim 1, wherein the roughness profile Pa is about 0.4 μm, and the mean period of the said profile is $P_{SM}$ is higher than 2 mm.

6. Part according to claim 1, wherein the part comprises a component of an automobile.

7. Part according to claim 1, wherein the thin layer comprises amorphous carbon (DLC).

8. Part according to claim 1, wherein the part comprises a component of an engine.

9. Part according to claim 1, wherein the surface has a roughness (Ra) of 0.36 μm or higher.

10. Part according to claim 1, wherein the thin hard layer comprises a deposit of a transition metal nitride.

\* \* \* \* \*

UNITED STATES PATENT AND TRADEMARK OFFICE
CERTIFICATE OF CORRECTION

PATENT NO. : 8,722,197 B2  
APPLICATION NO. : 12/444240  
DATED : May 13, 2014  
INVENTOR(S) : Maurin-Perrier et al.

Page 1 of 1

It is certified that error appears in the above-identified patent and that said Letters Patent is hereby corrected as shown below:

In the Claims

Column 4, Line 23: Claim 1, Delete " $A = \dfrac{P^2_{SM} \geq 5 \times 10^5\ \mu m}{Pa,}$ "

and insert -- $A = \dfrac{P_{SM}^2 \geq 5 \times 10^5\ \mu m}{Pa,}$ --

Signed and Sealed this  
Twelfth Day of August, 2014

Michelle K. Lee  
*Deputy Director of the United States Patent and Trademark Office*